United States Patent
Boyd

(10) Patent No.: US 6,366,626 B1
(45) Date of Patent: Apr. 2, 2002

(54) SUB-SYMBOL MATCHED FILTER-BASED FREQUENCY ERROR PROCESSING FOR SPREAD SPECTRUM COMMUNICATION SYSTEMS

(75) Inventor: Robert W. Boyd, Eidson, TN (US)

(73) Assignee: Wherenet Corp., San Ramon, CA (US)

( * ) Notice: Subject to any disclaimer, the term of this patent is extended or adjusted under 35 U.S.C. 154(b) by 0 days.

(21) Appl. No.: 09/159,242

(22) Filed: Sep. 23, 1998

Related U.S. Application Data

(60) Provisional application No. 60/060,186, filed on Sep. 26, 1997.

(51) Int. Cl.[7] .............................. H03D 1/00; H04L 27/06
(52) U.S. Cl. ..................................................... 375/343
(58) Field of Search ................................ 375/343, 350, 375/142, 143, 150, 152; 333/165; 342/189; 327/317, 319

(56) References Cited

U.S. PATENT DOCUMENTS 5,694,388 A * 12/1997 Sawahashi et al. ......... 370/206
5,867,526 A * 2/1999 Nagazumi .................... 345/207
6,154,487 A * 11/2000 Murai et al. ................. 375/150
6,208,683 B1 * 3/2001 Mizuguchi et al. .......... 375/140

* cited by examiner

*Primary Examiner*—Mohammad H. Ghayour
(74) *Attorney, Agent, or Firm*—Allen, Dyer, Doppelt, Milbrath & Gilchrist, P.A.

(57) ABSTRACT

To accommodate the large frequency uncertainty associated with low cost spread spectrum systems, a matched filter architecture is subdivided into cascaded sub-symbol filter segments, the number of which is selected to prevent loss of unacceptable signal energy over the received signal frequency uncertainty. The sub-symbol filter segments are processed in plural phase rotation-signal combiner stages, outputs of which are associated with multiple frequency bins. A respective phase rotation-signal combiner stage multiplies sub-symbol filter segments by respectively offset phase rotation vectors, associated with the plural frequency bins. The sub-symbol phase vector products of each stage are summed to produce plural frequency bin outputs.

16 Claims, 3 Drawing Sheets

SUB-SYMBOL MATCHED FILTER-BASED FREQUENCY ERROR PROCESSING FOR SPREAD SPECTRUM COMMUNICATION SYSTEMS

CROSS-REFERENCE TO RELATED APPLICATION

The present application claims the benefit of Provisional Patent Application Ser. No. 60/060,186, filed Sep. 26, 1997, entitled: "Firefly," assigned to the assignee of the present application and the disclosure of which is incorporated herein.

FIELD OF THE INVENTION

The present invention relates in general to communication systems, and is particularly directed to reduced complexity matched filter architecture having its temporal length subdivided into cascaded sub-symbol filter segments, the number of sub-symbol segments is selected to prevent loss of an unacceptable amount of signal energy over received signal frequency uncertainty $\delta_f$. The sub-symbol filter segments are processed in plural phase rotation-signal combiner stages, outputs of which are associated with multiple frequency bins, the number of which is a trade-off between desired granularity and cost. A respective phase rotation-signal combiner stage multiplies sub-symbol filter segments by respectively offset phase rotation vectors, associated with the plural frequency bins. The sub-symbol phase vector products of each stage are summed to produce plural frequency bin outputs.

BACKGROUND OF THE INVENTION

A frequent requirement of portable wireless devices (e.g., pagers or tag-embedded transponders for object tracking) is that the transmitter be small, inexpensive and battery-powered. This dictates using relatively low cost components that not only transmit a signal at a relatively low power level but inherently have relatively 'sloppy' tolerances that result in a large frequency uncertainty $\delta_f$. Often the only effective means to realize a useful communication range is to transmit relatively long (e.g., low data rate spread spectrum) symbols, so as to increase the total energy per symbol to an acceptable level. At a receiver site, this mandates processing each symbol in a coherent fashion in order to fully exploit its energy. Unfortunately, the frequency uncertainty $\delta_f$ is often too high relative to the symbol rate $R_s$ to allow conventional matched filter processing. Indeed, FIG. 1, which shows the implementation loss of coherent signal processing as a function of the $\delta_f/R_s$ ratio, reveals unacceptable recovered energy degradation when the $\delta_f/R_s$ ratio exceeds +/−0.5 cycles per symbol. This frequency uncertainty problem has often been corrected at the receiver by 'tuning' the receiver's signal processing mechanism to what was received.

As diagrammatically illustrated in FIG. 2, this typically involves adjusting a local oscillator 11, whose output is multiplied in a mixer 12 by a received signal 13 for application to a downstream matched filter 15. Where tuning a single local oscillator is infeasible, for example where the transmitted signal is of relatively short duration (e.g., bursty) or multiple signals are transmitted simultaneously (as in the case of multiple pagers or tag transponders, referenced above), the receiver's processing circuitry may be replicated multiple times, as shown in FIG. 3, using a plurality of respectively different local oscillators $LO_1$, $LO_2$, $LO_3$, $LO_4$, . . . , $LO_M$ to ensure that one of the plurality of local oscillator—mixer—matched filter processing paths 12-1/15-1, . . . , 12-N/15-M (frequency bins) will produce an output signal having an acceptable $\delta_f/R_s$ ratio. Unfortunately, this matched filter circuitry replication approach necessarily substantially increases the complexity and cost of the receiver processor.

SUMMARY OF THE INVENTION

In accordance with the present invention, the above discussed frequency uncertainty problem is successfully addressed by a new and improved 'sub-symbol' matched filter architecture, that subdivides the matched filter into a plurality of successive (cascaded) sub-symbol filter segments $MF_1$, $MF_2$, $MF_3$, . . . $MF_N$. Each sub-symbol filter segment has a duration $T_s/N$ (where $T_s$ is the overall temporal span of the matched filter). The segment duration $T_s/N$ is short enough to avoid the loss of an unacceptable amount of signal energy over the frequency uncertainty $\delta_f$ that would otherwise prevent recovery of the transmitted signal.

Each sub-symbol matched filter segment $MF_i$ is applied to a plurality K of phase rotation-signal combiner stages $S_1$, $S_2$, $S_3$, . . . $S_K$, the outputs of which are associated with K frequency bins. A respective phase rotation-signal combiner stage $S_i$ contains a plurality of N multipliers that are operative to multiply the outputs of the sub-symbol filter segments by a set of respectively offset phase rotation vectors. The sets of offset N phase rotation vectors of each of the phase rotation-signal combiner stages differ from one another, in association with the K frequency bins. The N sub-symbol phase vector products of a respective jth stage are summed to produce a respective one of the K frequency bin outputs.

The number K (of frequency bins) is a trade-off between the desired granularity of the filter and cost, while the number N (of sub-symbol segments) is selected to prevent loss of an unacceptable amount of signal energy over the frequency uncertainty $\delta_f$. The sub-symbol segmented matched filter processor facilitates implementing the multiple frequency bin paths of FIG. 3 by means of only a single matched filter data register, and replicating the same signal combiner circuitry for each of the plurality of K frequency bins. By quantizing the sub-symbols' phase rotations to readily implementable digital signal processing values, such as integral multiples of π/2 (90°), the circuit complexity of the phase rotation multipliers is reduced to direct and inverted connections between a respective sub-symbol segment and a single adder. This enables plural frequency bins for relatively long symbols to be processed on a single integrated circuit chip.

DETAILED DESCRIPTION

Figure 1:
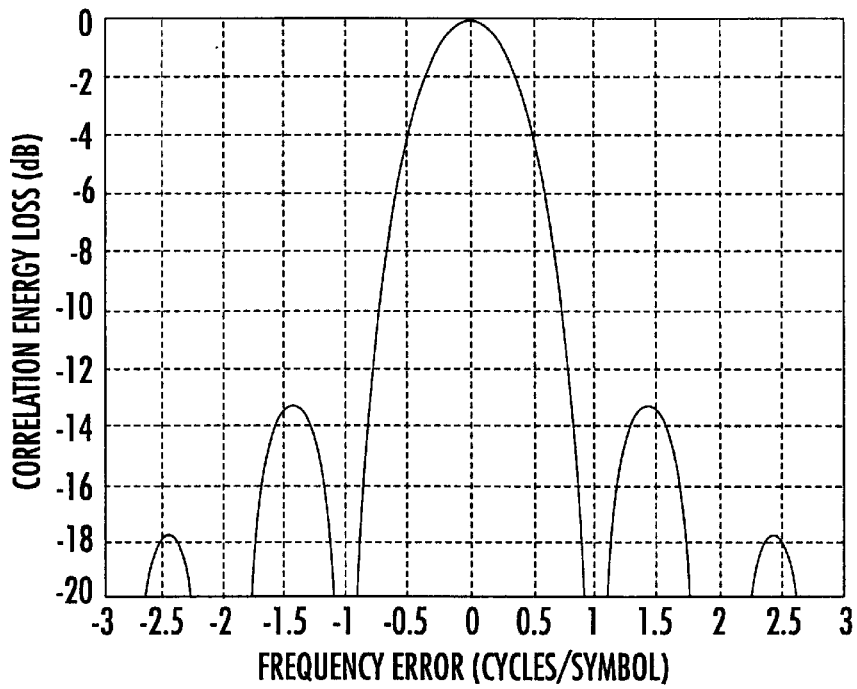
FIG. 1 shows the relationship between implementation loss of coherent signal processing and $\delta_f/R_s$ ratio.
Figure 2:
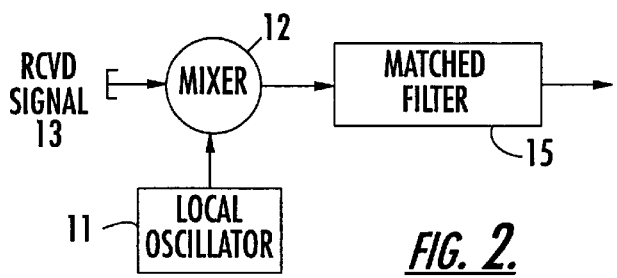
FIG. 2 diagrammatically illustrates a conventionally tuning network for adjusting a local oscillator whose output is multiplied by a received signal for application to a downstream matched filter.

Before describing in detail the sub-symbol matched filter architecture of the present invention, it should be observed that the invention resides primarily in what is effectively a prescribed arrangement of conventional communication circuits and associated digital signal processing components. Consequently, the configuration of such circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations to be described are primarily intended to show the major components of the system in a convenient functional grouping and processing sequence, whereby the present invention may be more readily understood.

The frequency error processing functionality of the cascaded sub-symbol matched filter mechanism of the invention may be readily understood by considering a received signal resulting from transmission of a single symbol to be non-zero over a time interval t between 0 and $T_s$. The transfer function MF(t) of a matched filter MF may be represented by the equation (1):

$$MF(t) = \int_0^{T_s} r(t)R(t)dt \quad (1)$$

where r(t) is the received signal waveform and R(t) is a locally generated replica (e.g., of a spreading PN waveform). If the received signal r(t) has the same signature as the known signal s(t), with some frequency shift ($\omega_s$) and the replica signal is shifted $\omega_{LO}$ (by the local oscillator) in an effort to match the received waveform, the output MF(t) of the matched filter becomes that set forth in equation (2) as:

$$MF(t) = \int_0^{T_s} \exp(\omega_s - \omega_{LO}) s(t) s^*(t) dt \quad (2)$$
$$\approx \text{sinc}(f_\delta T_s) \int_0^{T_s} s(t) s^*(t) dt$$

This integral may be subdivided into N segments, as shown in equation (3) as:

$$\int_0^{T_s} \exp(\omega_s - \omega_{LO}) s(t) s^*(t) dt = \quad (3)$$
$$\sum_{k=0}^{N-1} \int_{kT_s/N}^{(k+1)T_s/N_s} \exp(\omega_s - \omega_{LO}) s(t) s^*(t) \approx$$
$$\text{sinc}(f_\delta T_s/N) \sum_{k=0}^{N-1} \exp(j2\pi f_\delta k/N) \int_{kT_s/N}^{(k+1)T_s/N_s} s(t) s^*(t) dt$$

Equation (3) represents the summation of N phase-rotated partial matched filter outputs, and illustrates that the loss due to frequency uncertainty or mismatch is associated with sinc ($f_\delta T_s/N$), rather than sinc ($f_\delta T_s$), where $f_\delta = 2\pi(\omega_s - \omega_{LO})$, resulting in a substantial reduction in processing loss associated with non-coherence relative to conventional matched filtering.

Figure 4:
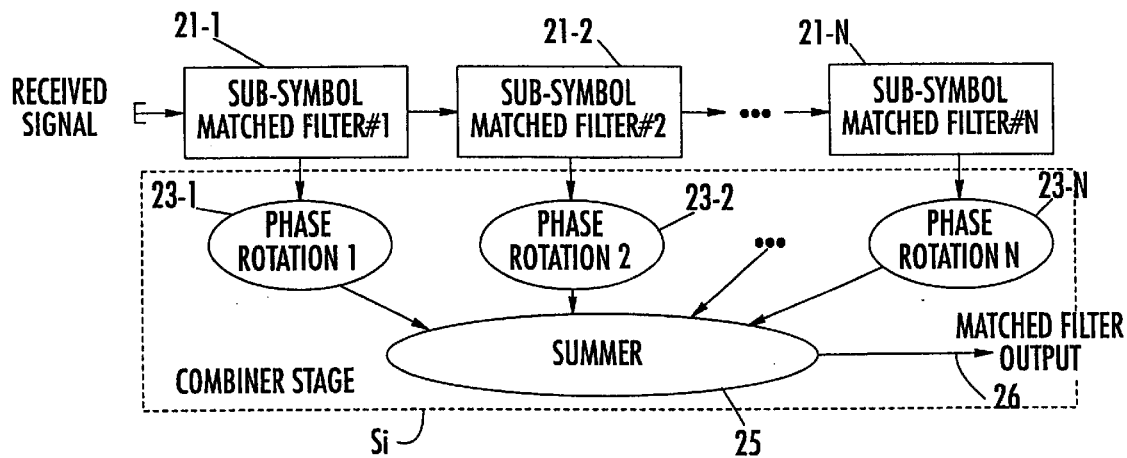
FIG. 4 diagrammatically illustrates a sub-symbol matched filter architecture of the present invention.
Figure 5:
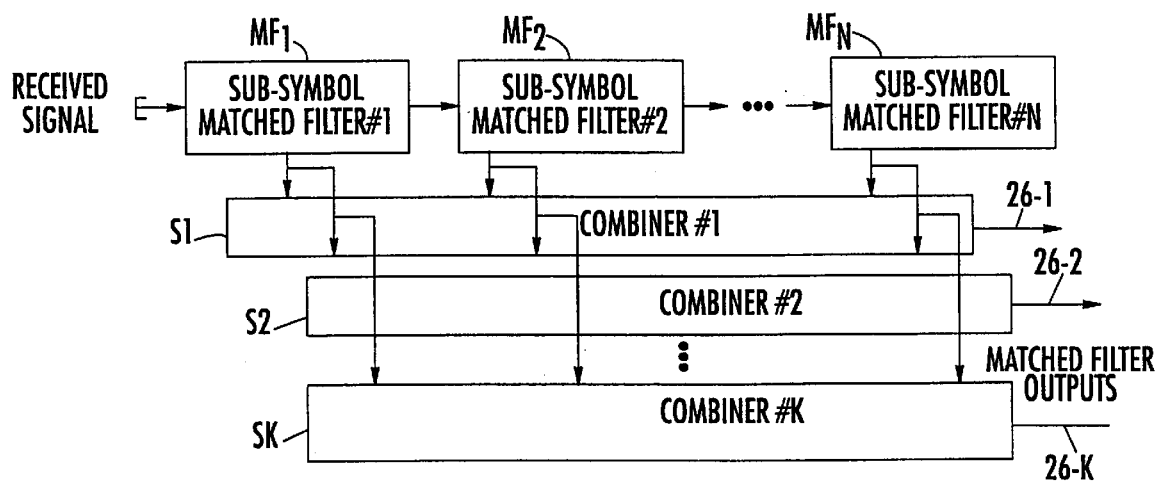
FIG. 5 diagrammatically illustrates a sub-symbol matched filter architecture having a single matched filter data register and a replicated set of phase rotation-signal combiner stages.

FIGS. 4 and 5 diagrammatically illustrate an embodiment of a matched filter architecture of the present invention, that is operative to implement the signal processing functionality of equation (3). As shown therein, the overall temporal length of the matched filter has a time span $T_s$ equal to the symbol duration $1/R_s$, and is segmented or subdivided into a series of N cascaded, reduced length sub-symbol (multichip) matched filter segments MF, respectively shown at 21-1, 21-2, . . . , 21-N. Each sub-symbol matched filter segment $MF_i$ comprises a respectively successive portion of a matched filter correlator to which a reference signal, such as a PN code, is applied to a plurality K of phase rotation-signal combiner stages $S_1, S_2, \ldots, S_K$, the outputs of which are associated with K frequency bins. In terms of a practical device, the number of frequency bins is a trade-off between the desired granularity of the filter and cost. As pointed out above, the number N (of sub-symbol segments) is selected to prevent loss of an unacceptable amount of signal energy over the frequency uncertainty $\delta_f$. By an appropriate choice of the value of N (e.g., eight, as a non-limiting example), cost and complexity of the architecture are reduced.

A respective phase rotation-signal combiner stage $S_i$ is operative to multiply the outputs of the sub-symbol filter segments 21-1, 21-2, . . . , 21-N by a set of N respectively offset phase rotation vectors. The sets of offset N phase rotation vectors of each of the phase rotation-signal combiner stages differ from one another (for example, in binary multiples of π/2 (90°), in association with the K respectively different frequency bins. The N sub-symbol phase vector products of a respective jth stage Sj are summed to produce a respective one of the K frequency bin outputs. By imparting appropriate (relatively offset) phase rotations 23-1, 23-2, . . . , 23-N to these N matched filter segments, the filter segments can be combined (summed), so as to effectively emulate any selected matched filter processing path of the multiple bin increased hardware complexity approach of FIG. 3.

The effect of this cascaded phase rotation is to move the frequency mismatch to the output of the sub-symbol matched filters. Namely, by properly selecting phase rotations 23-1, 23-2, . . . , 23-N, to which the matched filter segments are respectively applied, prior to being combined or summed in a summing unit 25 to provide a matched filter output 26, loss due to frequency uncertainty becomes a function of the ratio $\delta_f/(N^*R_s)$, which can be made acceptably small for any frequency uncertainty $\delta_f$ or received symbol rate $R_s$ by a proper choice of N. To recover the processed signal, the frequency bin producing the largest summation magnitude is selected.

Figure 3:
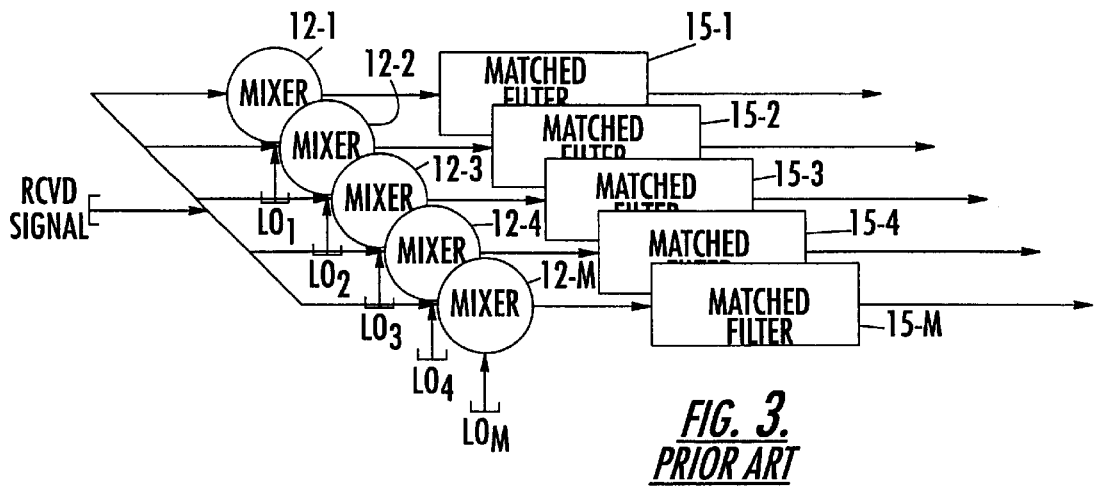
FIG. 3 shows a conventional multi-bin matched filter architecture containing a plurality of the signal processing networks of FIG. 2.
Figure 6:
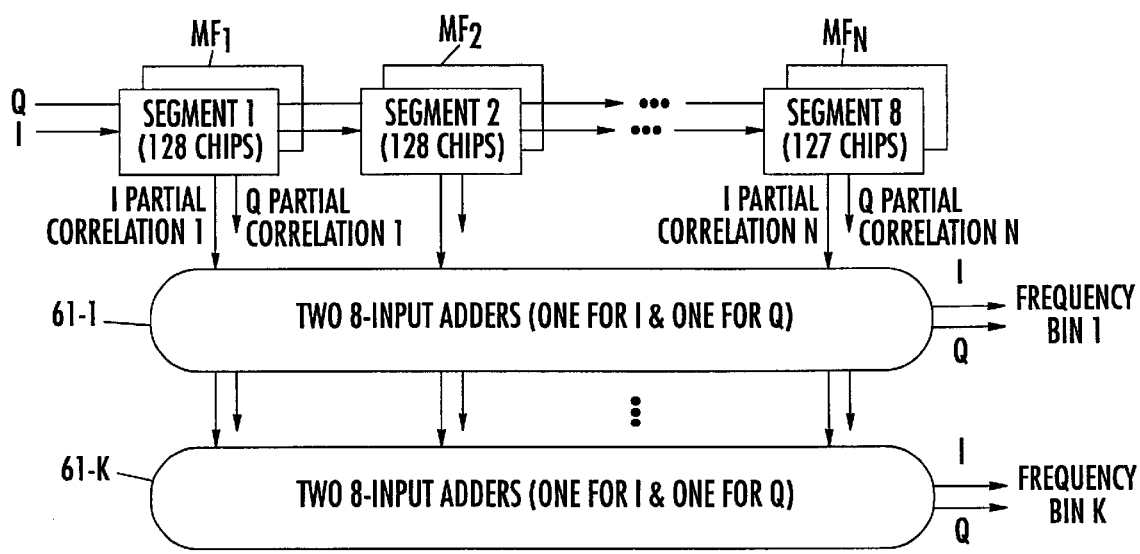
FIG. 6 shows a non-limiting example of the sub-symbol matched filter architecture of FIG. 5 implemented in N=eight cascaded chip increments for a 1023-chip PN spread waveform.

As shown in FIG. 5, a significant feature of the sub-symbol segmented matched filter processor of FIG. 4 is that it facilitates implementing the multiple frequency bin paths of FIG. 3, by means of only a single matched filter correlator, and replicating the same signal combiner circuitry 61-1, . . . , 61-K (e.g. a pair of N-input adders (one of the in-phase (I) channel and one for the quadrature (Q) channel) for each of the plurality of K frequency bins). FIG. 6 shows a non-limiting example of a matched filter delay line implemented in N=eight cascaded chip increments for a 1023-chip PN spread waveform.

As noted earlier, the ability to use the same signal combiner circuitry significantly simplifies the processor implementation, where the number N of sub-symbols is relatively small (eight in the example of FIG. 6). As noted earlier, circuit complexity can be further reduced by quantizing the sub-symbols' phase rotations to readily implementable digital signal processing values, such as integral multiples of π/2 (90°), which reduces the circuit complexity of the phase rotation multipliers to direct and inverted connections between a respective sub-symbol segment and a single adder. This enables plural frequency bins for relatively long symbols to be processed on a single integrated circuit chip.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed is:

1. A matched filter of temporal length $T_s$ for processing a broadband signal of frequency uncertainty $\delta_f$ comprising:
    a plurality of N cascaded sub-symbol matched filter segments, each of which has a duration $T_s/N$ sufficient to prevent loss of signal energy over said frequency uncertainty $\delta_f$ that would prevent recovery of said broadband signal;
    a plurality of K phase rotation-signal combiner stages, outputs of which are associated with K frequency bins of said matched filter, a respective phase rotation-signal combiner stage being operative to produce a summation of products of outputs of said sub-symbol filter segments and a respective set of mutually offset phase rotation vectors.

2. A matched filter according to claim 1, wherein said respective set of mutually offset phase rotation vectors comprises integral multiples of a prescribed phase vector value.

3. A matched filter according to claim 2, wherein said prescribed phase vector value comprises an integral multiple of π/2.

4. A matched filter according to claim 1, wherein said broadband signal comprises a spread spectrum signal.

5. A matched filter according to claim 1, wherein a respective phase rotation-signal combiner stage comprises a plurality of N multipliers that are operative to multiply the outputs of said N sub-symbol filter segments by a set of K mutually differentially offset phase rotation vectors, and an adder which sums N sub-symbol phase vector products of a respective one of said K phase rotation-signal combiner stages to produce a respective one of the K frequency bin associated outputs.

6. A matched filter according to claim 5, wherein a set of mutually differentially offset phase rotation vectors comprises integral multiples of a prescribed phase vector value.

7. A matched filter according to claim 6, wherein said prescribed phase vector value comprises an integral multiple of π/2.

8. A matched filter according to claim 1, wherein a respective phase rotation-signal combiner stage comprises an adder and direct and inverted connections between said sub-symbol segments and said adder.

9. A matched filter according to claim 8, wherein a set of mutually differentially offset phase rotation vectors comprises integral multiples of a prescribed phase vector value.

10. A matched filter according to claim 9, wherein said prescribed phase vector value comprises an integral multiple of π/2.

11. A method for processing a broadband signal of frequency uncertainty $\delta_f$ comprising the steps of:
    (a) coupling said broadband signal through successive ones of a plurality of N cascaded sub-symbol matched filter segments of a matched filter of temporal length $T_s$, each sub-symbol matched filter segment having a duration $T_s/N$ sufficient to prevent loss of signal energy over said frequency uncertainty $\delta_f$ that would prevent recovery of said broadband signal;
    (b) generating K summations of products of said N sub-symbol filter segments and K respectively different sets of N mutually offset phase rotation vectors, said K summations being associated with K respectively different frequency bins; and
    (c) selecting the largest of said K summations generated in step (b).

12. A method according to claim 11, wherein a respective set of mutually offset phase rotation vectors comprises integral multiples of a prescribed phase vector value.

13. A method according to claim 12, wherein said prescribed phase vector value comprises an integral multiple of π/2.

14. A method according to claim 11, wherein step (b) comprises multiplying outputs of said N sub-symbol filter segments by respectively different sets of K mutually differentially offset phase rotation vectors, and summing resulting N sub-symbol phase vector products to produce K frequency bin associated signal outputs.

15. A method according to claim 11, wherein step (b) comprises providing direct and inverted connections between said sub-symbol segments and K respective adders.

16. A method according to claim 11, wherein said broadband signal comprises a spread spectrum signal.

* * * * *